(12) United States Patent
Gilmore et al.

(10) Patent No.: US 8,134,812 B2
(45) Date of Patent: *Mar. 13, 2012

(54) ENERGY CONVERSION SYSTEM WITH FAULT DETECTION AND INTERRUPTION

(75) Inventors: Jack Arthur Gilmore, Fort Collins, CO (US); Eric Seymour, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/830,380

(22) Filed: Jul. 5, 2010

(65) Prior Publication Data

US 2011/0157753 A1      Jun. 30, 2011

Related U.S. Application Data

(63) Continuation of application No. 12/022,147, filed on Jan. 29, 2008, now Pat. No. 7,768,751.

(51) Int. Cl.
*H02H 3/16* (2006.01)
(52) U.S. Cl. ............................................ 361/42; 361/44
(58) Field of Classification Search ............... 361/42–50; 136/244, 245
See application file for complete search history.

(56) References Cited

U.S. PATENT DOCUMENTS

| | | | |
|---|---|---|---|
| 3,986,097 A | 10/1976 | Woods | |
| 4,025,862 A | 5/1977 | Gautheron | |
| 4,054,827 A | 10/1977 | Reimers | |
| 4,080,646 A | 3/1978 | Dietrich | |
| 4,128,793 A | 12/1978 | Stich | |
| 4,161,023 A | 7/1979 | Goffeau | |
| 4,678,983 A | 7/1987 | Rouzies | |
| 4,748,311 A | 5/1988 | Thomas | |
| 5,270,636 A | 12/1993 | Lafferty | |
| 5,451,962 A | 9/1995 | Steigerwald | |
| 5,781,419 A | 7/1998 | Kutkut et al. | |
| 5,923,100 A | 7/1999 | Lukens et al. | |
| 5,932,994 A | 8/1999 | Jo et al. | |
| 6,115,273 A | 9/2000 | Geissler | |
| 6,266,260 B1 | 7/2001 | Zahrte, Sr. et al. | |
| 6,404,655 B1 | 6/2002 | Welches | |

(Continued)

FOREIGN PATENT DOCUMENTS

JP    07-049721 A    2/1995

(Continued)

OTHER PUBLICATIONS

IEEE, "Std. 519-1992", "IEEE Recommended Practices", Apr. 12, 1993, pp. 1-100, Publisher: IEEE.

(Continued)

*Primary Examiner* — Danny Nguyen
(74) *Attorney, Agent, or Firm* — Neugeboren O'Dowd PC; Sean R. O'Dowd

(57) ABSTRACT

Fault detection and interruption in connection with photovoltaic technologies are disclosed. An exemplary apparatus for interrupting a photovoltaic energy conversion system that employs a bipolar photovoltaic array includes a fault detector and interrupter configured to be coupled to the first and the second rails of the photovoltaic array, the fault detector and interrupter configured to detect a condition that requires interruption of the photovoltaic energy conversion system and open a PV tie to uncouple two PV arrays of the bipolar photovoltaic array, thereby decoupling the two PV arrays; and a controller configured to, after the PV tie is opened, open a plurality of main DC contactors thereby decoupling the bipolar photovoltaic array from a remainder portion of the energy conversion system.

3 Claims, 8 Drawing Sheets

U.S. PATENT DOCUMENTS

| | | | |
|---|---|---|---|
| 6,625,046 | B2 | 9/2003 | Geissler |
| 6,812,396 | B2 | 11/2004 | Makita et al. |
| 6,844,739 | B2 | 1/2005 | Kasai et al. |
| 6,914,418 | B2 | 7/2005 | Sung |
| 7,053,506 | B2 | 5/2006 | Alonso et al. |
| 7,292,419 | B1 | 11/2007 | Nemir |
| 7,619,200 | B1 | 11/2009 | Seymour et al. |
| 7,701,081 | B2 | 4/2010 | Seymour |
| 7,768,751 | B2 | 8/2010 | Gilmore et al. |
| 2001/0004322 | A1 | 6/2001 | Kurokami et al. |
| 2001/0023703 | A1 | 9/2001 | Kondo et al. |
| 2001/0048605 | A1 | 12/2001 | Kurokami et al. |
| 2002/0105765 | A1 | 8/2002 | Kondo et al. |
| 2003/0155887 | A1 | 8/2003 | Bourilkov et al. |
| 2003/0172968 | A1 | 9/2003 | Armer et al. |
| 2004/0211459 | A1 | 10/2004 | Suenaga et al. |
| 2005/0139259 | A1 | 6/2005 | Steigerwald et al. |
| 2005/0180181 | A1 | 8/2005 | Gaudreau et al. |
| 2006/0221653 | A1 | 10/2006 | Lai et al. |
| 2006/0227472 | A1 | 10/2006 | Taylor et al. |
| 2008/0291706 | A1 | 11/2008 | Seymour et al. |
| 2009/0032082 | A1 | 2/2009 | Gilmore et al. |
| 2009/0078304 | A1 | 3/2009 | Gilmore et al. |
| 2009/0167086 | A1 | 7/2009 | Seymour |
| 2009/0167097 | A1 | 7/2009 | Seymour et al. |
| 2009/0190275 | A1 | 7/2009 | Gilmore et al. |
| 2009/0217964 | A1 | 9/2009 | Gilmore et al. |
| 2009/0283130 | A1 | 11/2009 | Gilmore et al. |
| 2010/0132758 | A1 | 6/2010 | Gilmore |

FOREIGN PATENT DOCUMENTS

| | | | |
|---|---|---|---|
| JP | 10-014111 | | 1/1998 |
| JP | 10-229679 | | 8/1998 |
| JP | 11-285260 | A | 10/1999 |
| JP | 2000-295786 | A | 10/2000 |
| JP | 2000-358370 | A | 12/2000 |
| JP | 2002-319687 | A | 10/2002 |
| JP | 2003-124492 | A | 4/2003 |
| JP | 2004-015941 | A | 1/2004 |
| JP | 2004-343909 | A | 12/2004 |
| JP | 2005-204485 | A | 7/2005 |
| JP | 2006-187150 | A | 7/2006 |
| JP | 2007-201257 | A | 8/2007 |
| KR | 10-2006-0100840 | | 9/2006 |
| KR | 20-2006-0021132 | | 10/2006 |
| WO | 2007022955 | A1 | 3/2007 |

OTHER PUBLICATIONS

Yao, Gang, et al., "Interleaved Three-Level Boost Converter with Zero Diode Reverse-Recovery Loss", "Applied Power Electronics Conference and Exposition", Sep. 1, 2004, pp. 1090-1095, vol. 2, Publisher: IEEE, Published in: US.

Gow, J.A., et al., "Photovoltaic Converter System Suitable for Use in Small Scale Stand-Alone or Grid Connected Applications", "Proceedings Electric Power Applications", Nov. 1, 2000, pp. 535-543, vol. 147, No. 6, Publisher: IEEE, Published in: US.

Kwon, Jung-Min, et al., "Photovoltaic Power Conditioning System with Line Connection", "Transaction on Industrial Electronics", Aug. 1, 2006, pp. 1048-1054, vol. 53, No. 4, Publisher: IEEE, Published in: US.

Enslin, Johan, et al., "Integrated Photovoltaic Maximum Power Point Tracking Converter", "Transactions on Industrial Electronics", Dec. 1, 1997, pp. 769-773, vol. 44, No. 6, Publisher: IEEE, Published in: US.

Walker, Geoffrey R., et al., "Cascaded DC-DC Converter Connection of Photovoltaic Modules", "Transactions on Power Electronics", Jul. 1, 2004, pp. 1130-1139, vol. 19, No. 4, Publisher: IEEE, Published in: US.

Kim, Jung-Han, et al., "A Study on the Harmonic Elimination used Passive Filter and Active Filter", "KIIEE", 2001, pp. 77-83, Publisher: KIIEE, Published in: KR.

Ahmed, K.H., et al., "Passive Filter Design for Three-Phase Inverter Interfacing in Distributed Generation", "Electrical Power Quality and Utilization Journal", 2007, pp. abstract, Fig. 1 19, vol. 13, No. 2, Published in: US.

Choi, Nam Ho, "PCT International Search Report re Application No. PCT/US08/064263", Oct. 31, 2008, Published in: PCT.

Park, Jae Hun, "PCT International Search Report re Application No. PCT/US08/072108", Feb. 24, 2009, Published in: PCT.

Koh, Jae Hyun, "PCT International Search Report re Application No. PCT/US08/077734", Apr. 29, 2009, Published in: PCT.

Bae, Jin Yong, "PCT International Search Report re Application No. PCT/US08/086931", Jun. 25, 2009, Published in: PCT.

Bae, Jin Yong, "PCT International Search Report re Application No. PCT/US08/087078", Jul. 9, 2009, Published in: PCT.

Han, Sang Il, "PCT International Search Report re Application No. PCT/US09/031549", Aug. 17, 2009, Published in: PCT.

Nickitas-Etienne, Athina, "International Preliminary Report on Patentability and Written Opinion re Application No. PCT/US09/031549", Aug. 12, 2010, Published in: PCT.

Ha, Jeong Kyun, "PCT International Search Report re Application No. PCT/US09/051855", Mar. 22, 2010, Published in: PCT.

Ha, Jeong Kyun, "PCT International Search Report re Application No. PCT/US09/054904", Aug. 23, 2010, Published in: PCT.

Guinea, William, "PCT International Search Report re Application No. PCT/US09/065629", Feb. 12, 2010, Published in: PCT.

Wang, T.C., et al., "Output Filter Design for a Grid-Interconnected Three-Phase Inverter", "IEEE", 2003, pp. 779-784, Publisher: IEEE, Published in: US.

Woo Hyuk Lee, "A Study on the Optimaztion of Input Filter for Switching Inverter", "Master Thesis", 1989, Publisher: Hanyang University.

Nickitas-Etienne, Athina, "PCT International Preliminary Report on Patentability", Aug. 12, 2010, Published in: PCT.

Zhang, Michael T., et al., "Single-Phase Three-Level Boost Power Factor Correction Converter", "Applied Power Electronic Conference and Exposition", Mar. 1, 1995, pp. 434-439, vol. 1, Publisher: IEEE, Published in: US.

Pinheiro, J.R., et al., "Dual Output Three-Level Boost Power Factor Correction Converter with Unbalanced Loads", "Power Electronics Specialists Conference", Jun. 1, 1996, pp. 733-739, vol. 1, Publisher: IEEE, Published in: US.

Sohn, Seung C., "Notice of Non-Compliant Amendment Office Action re U.S. Appl. No. 12/189,187", Aug. 12, 2009, p. 2 Published in: US.

Nguyen, Danny, "Office Action re U.S. Appl. No. 12/022,147", Jan. 22, 2010, p. 46 Published in: US.

Sohn, Seung C., "Office Action re U.S. Appl. No. 12/189,187", Apr. 3, 2009, p. 14 Published in: US.

Sohn, Seung C., "Office Action re U.S. Appl. No. 11/967,933", Oct. 4, 2010, p. 29 Published in: US.

Gardner, Shannon M., "Office Action re U.S. Appl. No. 12/184,535", Nov. 10, 2010, p. 7 Published in: US.

Moyse, Ellen, "International Preliminary Report on Patentability and Written Opinion re Application No. PCT/US08/072108", Feb. 18, 2010. Published in: PCT.

O'Dowd, Sean R., "Response to Oct. 4, 2010 Office Action re U.S. Appl. No. 11/967,933", Jan. 1, 2011, p. 6 Published in: US.

O'Dowd, Sean R., "Response to Jan. 22, 2010 Office Action re U.S. Appl. No. 12/022,147", Feb. 25, 2010, p. 28 Published in: US.

O'Dowd, Sean R., "Response to Nov. 10, 2011 Office Action re U.S. Appl. No. 12/184,535", Mar. 10, 2011, p. 14 Published in: US.

O'Dowd, Sean R., "Response to Apr. 3, 2009 Office Action re U.S. Appl. No. 12/189,187", Jun. 29, 2009, p. 51 Published in: US.

O'Dowd, Sean R., "Response to Notice of Non-Compliant Amendment re U.S. Appl. No. 12/189,187", Aug. 13, 2009, p. 10 Published in: US.

Sun Power, "Sun Power Discovers the Surface Polarization Effect in High Efficiency Solar Cells", Aug. 1, 2005, Published in: US.

ENERGY CONVERSION SYSTEM WITH FAULT DETECTION AND INTERRUPTION

FIELD OF THE INVENTION

This invention relates generally to apparatus and methods for converting solar energy to electrical energy, and more specifically to apparatus and methods for reliably detecting unsafe ground fault conditions and interrupting operation of such energy conversion systems when unsafe ground fault conditions are detected.

BACKGROUND OF THE INVENTION

The transformation of light energy into electrical energy using photovoltaic (PV) systems has been known for a long time and such photovoltaic energy conversion systems are increasingly being implemented in residential, commercial, and industrial applications. Rapid detection of unintended shunting of DC current to ground, also known as a ground fault, is mandatory for implementation of such systems because ground faults present potentially dangerous conditions, including fire risk. Accordingly, for safety reasons photovoltaic energy conversion systems must rapidly detect ground fault conditions and automatically interrupt operation when appropriate.

Photovoltaic systems typically include, among other components, a photovoltaic array that generates DC power and an inverter that converts the DC power to AC power (e.g., single phase or three phase power). In such systems, a ground fault detector and interrupter (GFDI) is typically employed to detect DC current flowing between the PV array and ground. Some of the components used in a ground fault detector and interrupter are not capable of being certified as high integrity components, which means that the reliability of such components as used in the ground fault detector and interrupter is not guaranteed to be at an acceptable level. Because the ground fault detector and interrupter is often critical to the safe operation of the PV energy conversion system, measures must be taken to ensure that the ground fault detector and interrupter operates correctly at all times. Accordingly, apparatus and methods are needed to ensure continuously that the ground fault detector and interrupter is operating correctly.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

In one embodiment, the invention may be characterized as a method for interrupting a photovoltaic energy conversion system that employs a bipolar photovoltaic array. The method in this embodiment includes detecting a condition that requires interruption of the photovoltaic energy conversion system; opening a PV tie to uncouple two PV arrays of the bipolar photovoltaic array, thereby decoupling the two PV arrays; after the PV tie is opened, opening a plurality of main DC contactors thereby decoupling the bipolar photovoltaic array from the energy conversion system.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
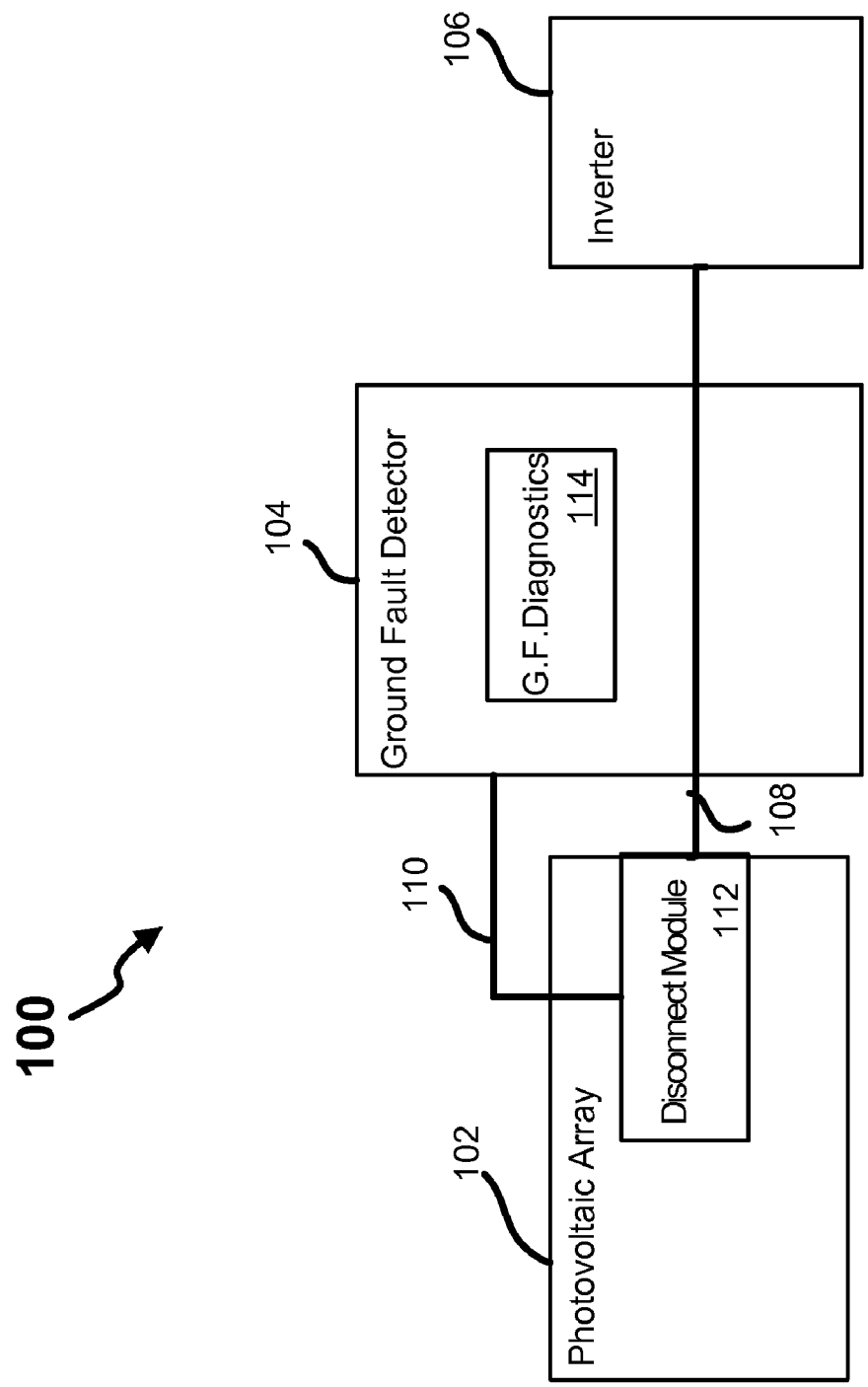
FIG. 1 is a block diagram depicting an exemplary embodiment of a photovoltaic energy conversion system comprising a ground fault detector and interrupter.

Referring now to the drawings, where like or similar elements are designated with identical or corresponding reference numerals throughout the several views, and referring in particular to FIG. 1, shown is a block diagram depicting a photovoltaic power conversion system 100 that includes a photovoltaic array 102 coupled to an inverter 106. Coupled between the photovoltaic array 102 and the inverter 106 is a ground fault detector and interrupter 104. Conductor lines 108 couple the photovoltaic array 102 to the inverter 106, and the ground fault detector and interrupter 104 is coupled (e.g., inductively coupled) to the conductor lines 108. As shown, the ground fault detector and interrupter 104 includes a diagnostics portion 114, and the ground fault detector and interrupter 104 is coupled to a disconnect module 112 via a ground fault signal line 110.

It should be recognized that the illustrated arrangement of the components depicted in FIG. 1 is logical and not meant to be an actual hardware diagram; thus, the components can be combined or further separated in an actual implementation. For example, the ground fault detector 104 may be realized by hardware and/or software that is also used within the inverter 106. And in some implementations, the disconnect module 112 may be spatially separated from the photovoltaic array 102.

In general, the photovoltaic array 102 converts solar energy to DC electrical current, which is converted to AC power (e.g., single phase or three-phase power) by the inverter 106. The photovoltaic array 102 may be either a mono-polar or a bipolar array. The ground fault detector and interrupter 104 detects unsafe ground fault conditions and acts rapidly to cease the unsafe flow of DC current from the array 102 to ground. In many embodiments for example, the ground fault detector and interrupter 104 senses a ground fault and sends a ground fault signal 110 to the disconnect module 112 to isolate the array 102 (e.g., from ground and the inverter 106).

The diagnostics portion 114 is configured to test whether the ground fault detector and interrupter 104 is operating properly (e.g., operating to detect ground faults), and if the ground fault detector and interrupter 104 is not operating properly, the ground fault diagnostics portion 114 sends a ground fault signal 110 to the disconnect module 112 to take the array 102 offline.

Figure 2:
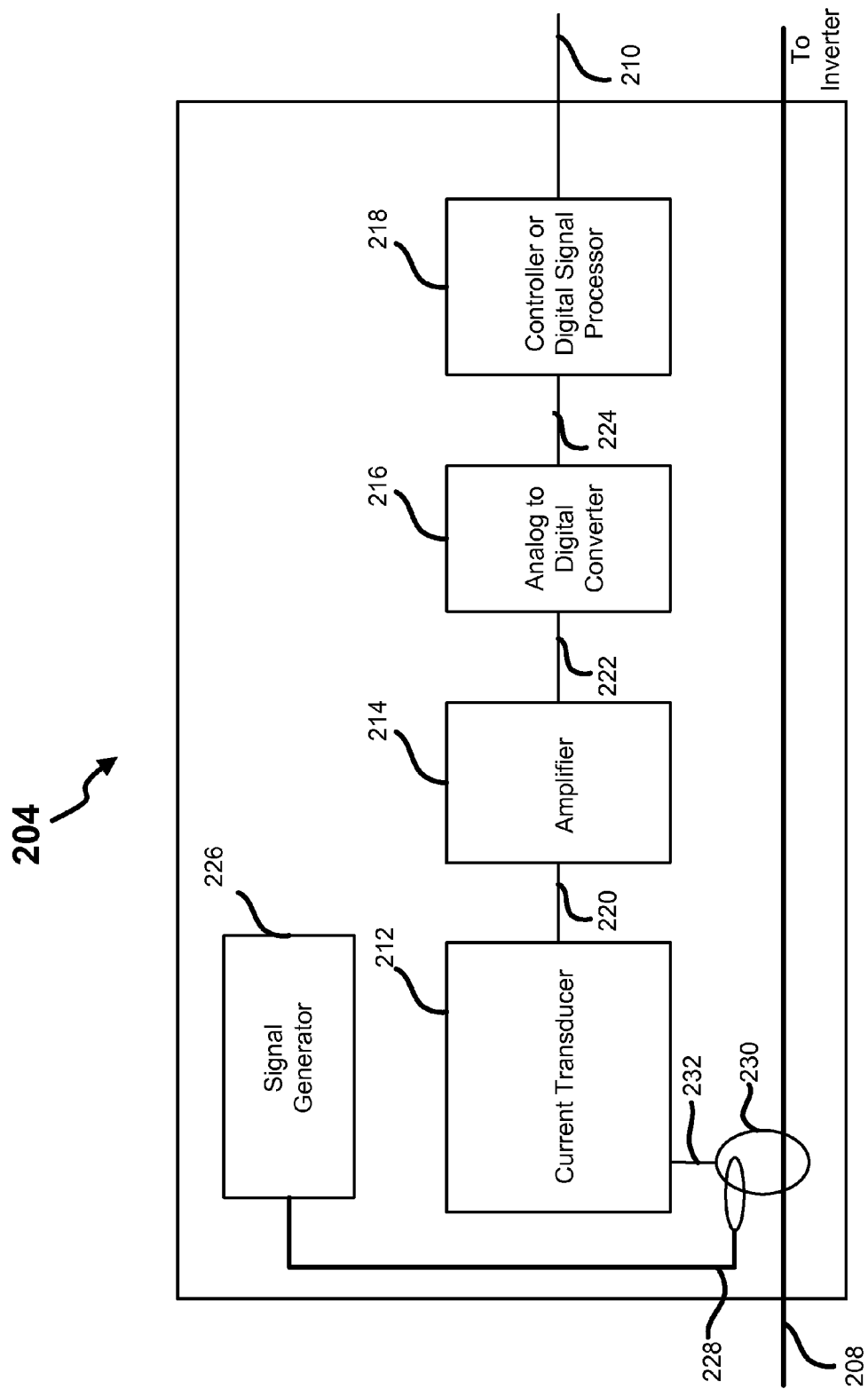
FIG. 2 is a block diagram depicting an exemplary embodiment of the ground fault detector and interrupter described with reference to FIG. 1.

Referring next to FIG. 2, shown is a block diagram representation of an exemplary embodiment of the ground fault detector and interrupter 104 of the system 100 described with reference to FIG. 1. As shown in the ground fault detector and interrupter 204 depicted in FIG. 2, input lines 208 from a photovoltaic array (e.g., photovoltaic array 102) are coupled to a DC current transducer 212. Although input lines 208 are depicted in the block diagram as a single line for ease of illustration, one skilled in the art will readily appreciate that two conductor lines are coupled to the DC current transducer 212. In a PV energy conversion system 100 that employs a mono-polar PV array 102, the two input lines 208 correspond to the positive and neutral (tied to ground) connections to the PV array 102. And in a PV energy conversion system that employs a bipolar photovoltaic array 102, the input lines 208 correspond to the positive and negative connections of the photovoltaic array 102.

Continuing to refer to FIG. 2, the ground fault detector and interrupter 204 comprises several components, including an amplifier 214, an analog-to-digital (A/D) converter 216 and a controller or digital signal processor 218. As shown the DC current transducer 212 is coupled to the amplifier 214 by connector lines 220, and the amplifier 214 is coupled to the A/D converter 216 by connector lines 222. As depicted, the A/D converter 216 is coupled to the controller or digital signal processor 218 by connector lines 224. Finally, the ground fault detector and interrupter 204 is coupled to the disconnect module 112 (not shown in FIG. 2) of the photovoltaic energy conversion system 100 by lines 210.

Under normal operating conditions, there is little or no difference in the magnitude of current flowing through the pair of input lines 208, but when a ground fault condition arises in the photovoltaic array 102, more current flow will flow on one of the input lines 208 than the other input line, and a current will be induced in a coil 230 of the current transducer 212 so as to create a fault signal that is fed to an input 232 of the current transducer 212. As discussed further herein, in many embodiments, the magnitude of the fault signal is utilized to determine whether a ground fault exists and/or the type of response that is required. In one embodiment, the current transducer 212 has a 100 KHz bandwidth, meant for sensing differential current flowing through the input lines 208. One skilled in the art will readily appreciate that current transducers having different traits and characteristics may be used to achieve the functional capabilities required for the application disclosed herein, depending on the specific implementation and application.

As shown, a signal 220 that is output from the current transducer 212 is amplified by the amplifier 214 to generate an amplified signal 222, which is converted to a digital signal 224 by the A/D converter 216. The controller or digital signal processor 218 then evaluates the digital signal 224 to determine whether a ground fault exists, and if so, whether the ground fault presents a condition that requires interruption of the photovoltaic energy conversion system 100.

In one embodiment, a detected current differential between signal lines 208 of more than 5.0 amperes requires interruption within a specified amount of time from detection; whereas a detected current differential that exceeds 7.5 amperes requires interruption within shorter amount of time from detection; and a detected current differential that exceeds 10 amperes requires interruption at an even shorter amount of time from detection. One skilled in the art will readily appreciate that such current thresholds and timing requirements for triggering interruption depend on the particular circumstances of the photovoltaic energy conversion system 100 in use, the specific compliance codes or regulations applied to the system in operation, or both. If a ground fault is detected and interruption is required, then the controller or digital signal processor 218 sends a signal 210 to actuate a one or more actuators (e.g., in the disconnect module 112) that open the connections between the photovoltaic array 102 and ground and between the photovoltaic array 102 and the system 100, thereby electrically isolating the photovoltaic array and stopping dangerous current flow.

In many embodiments, the ground fault detector and interrupter 204 is a critical operational safety feature of the photovoltaic energy conversion system 100, and thus it must operate correctly at all times that the system 100 is operating. It is possible that one or more components of the ground fault detector and interrupter 204 can fail, causing the ground fault detector and interrupter 204 to fail to detect a differential current indicating a ground fault condition. In such a situation, the photovoltaic energy conversion system 100 would continue to operate, prolonging a dangerous and potentially catastrophic condition.

As shown, in this embodiment a signal generator 226 is utilized in connection with the controller or digital signal processor 218 to realize a ground fault diagnostic function (e.g., that is carried out by the ground fault diagnostics portion 114). In particular, to assess whether the ground fault detector and interrupter 204 is operating properly, an additional signal 228 that is known (e.g., by virtue of being unique and/or having readily identifiable characteristics), which may also be referred to as a diagnostic signal or a reference signal, is supplied to the ground fault detector and interrupter 204 along with the signals induced from the input lines 208. In the embodiment depicted in FIG. 2 for example, the signal 228 is introduced to the coil 230 of the current transducer 230 by passing a signal line through the transducer coil 230. As a consequence, the input 232 of the current transducer 212 includes a combined signal comprising the diagnostic signal (transduced from the additional signal line 228) and the fault signal (transduced from current in lines 208) that propagates through the processing chain 212, 214, 216, 218 of the fault detector 204.

If the diagnostic signal 228 is detected by the controller or digital signal processor 218, which in this embodiment is at the end of processing chain 212, 214, 216, 218, then it may be assumed that the ground fault detector 204 is able to detect differential currents in the input lines 208. In other words, because the additional signal 228 is detected with the same processing chain 212, 214, 216, 218 that detects any current differential in the inputs 208 from the photovoltaic array 102, when the additional signal 228 is detected by the controller or digital signal processor 218, the processing chain 212, 214, 216, 218 is operating as expected. Thus detection of the additional signal 228 by the controller or digital signal processor 218 provides assurance that the ground fault detector and interrupter 204 will detect a ground fault condition if one arises. It is certainly contemplated that in other embodiments, the processing chain 212, 214, 216, 218 includes other components to detect a fault condition, and in these other embodiments the processing chain may still be assessed by detecting propagation of an additional signal through the processing chain.

In the exemplary embodiment shown in FIG. 2, the signal 228 is realized by a signal generator 226 that supplies a 1 kHz sine wave signal but this is certainly not required, and one skilled in the art will readily appreciate that many different electrical signals (e.g., different frequencies) may be supplied by the signal generator 226 to meet this objective.

Figure 3:
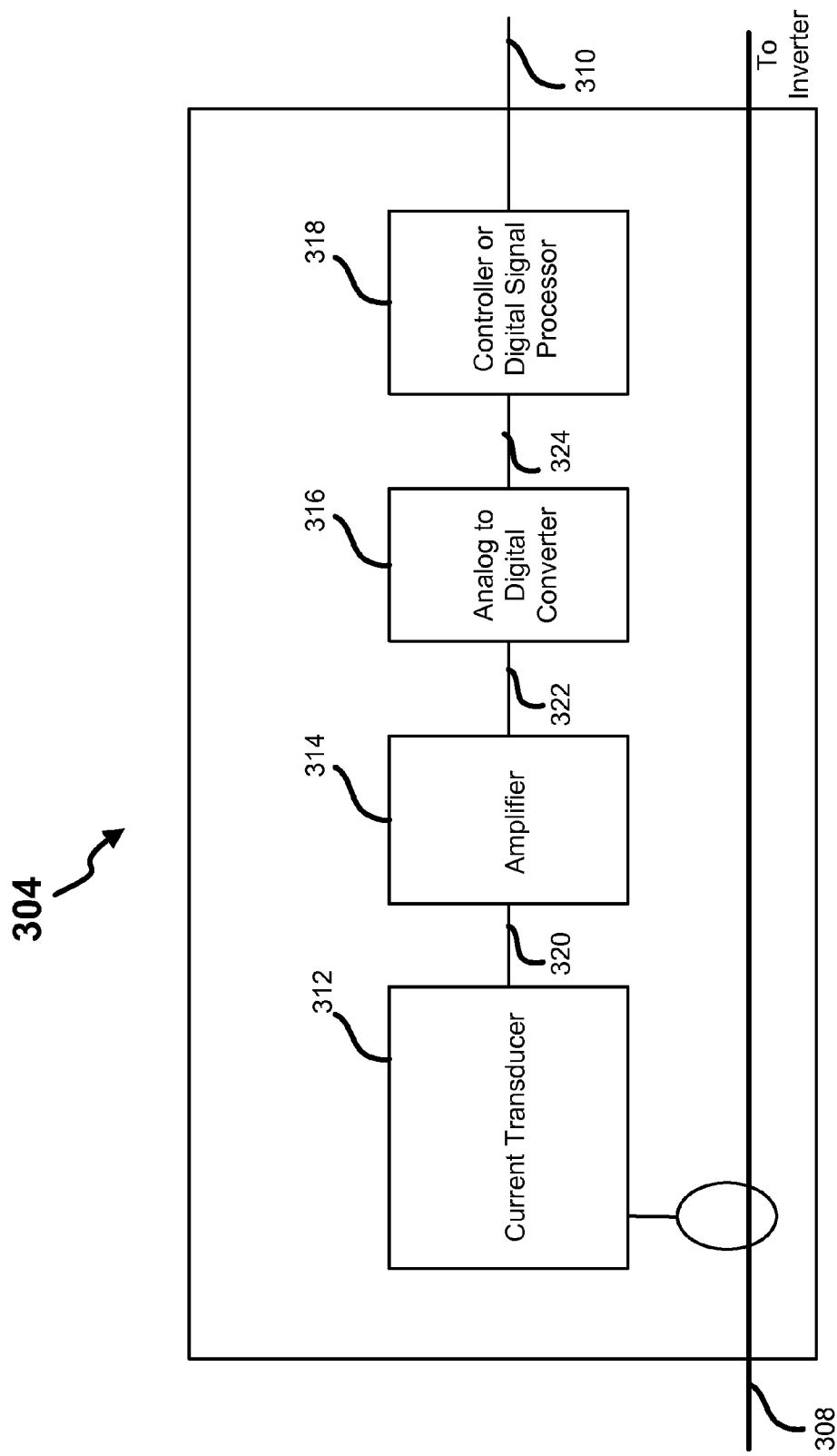
FIG. 3 is a block diagram depicting another exemplary embodiment of the ground fault detector and interrupter described with reference to FIG. 1.

Referring now to FIG. 3, another embodiment is depicted, which uses naturally occurring, common mode parasitic currents that are inherent to the photovoltaic energy conversion system 100 to introduce into the inputs of the ground fault detector and interrupter 304, thereby obviating the need for a separate signal generator 226. Such inherent signals include, for example, parasitic currents of 180 Hz (resulting from 3-phase configurations), 60 Hz (resulting from single phase configurations) and 16 kHz (which corresponds to the switching frequency used in one embodiment). One skilled in the art will readily appreciate that such naturally occurring parasitic currents will vary depending on the specific implementation of a given photovoltaic energy conversion system 100, and that such naturally occurring, common mode, parasitic currents may be used for this purpose.

Figure 4:
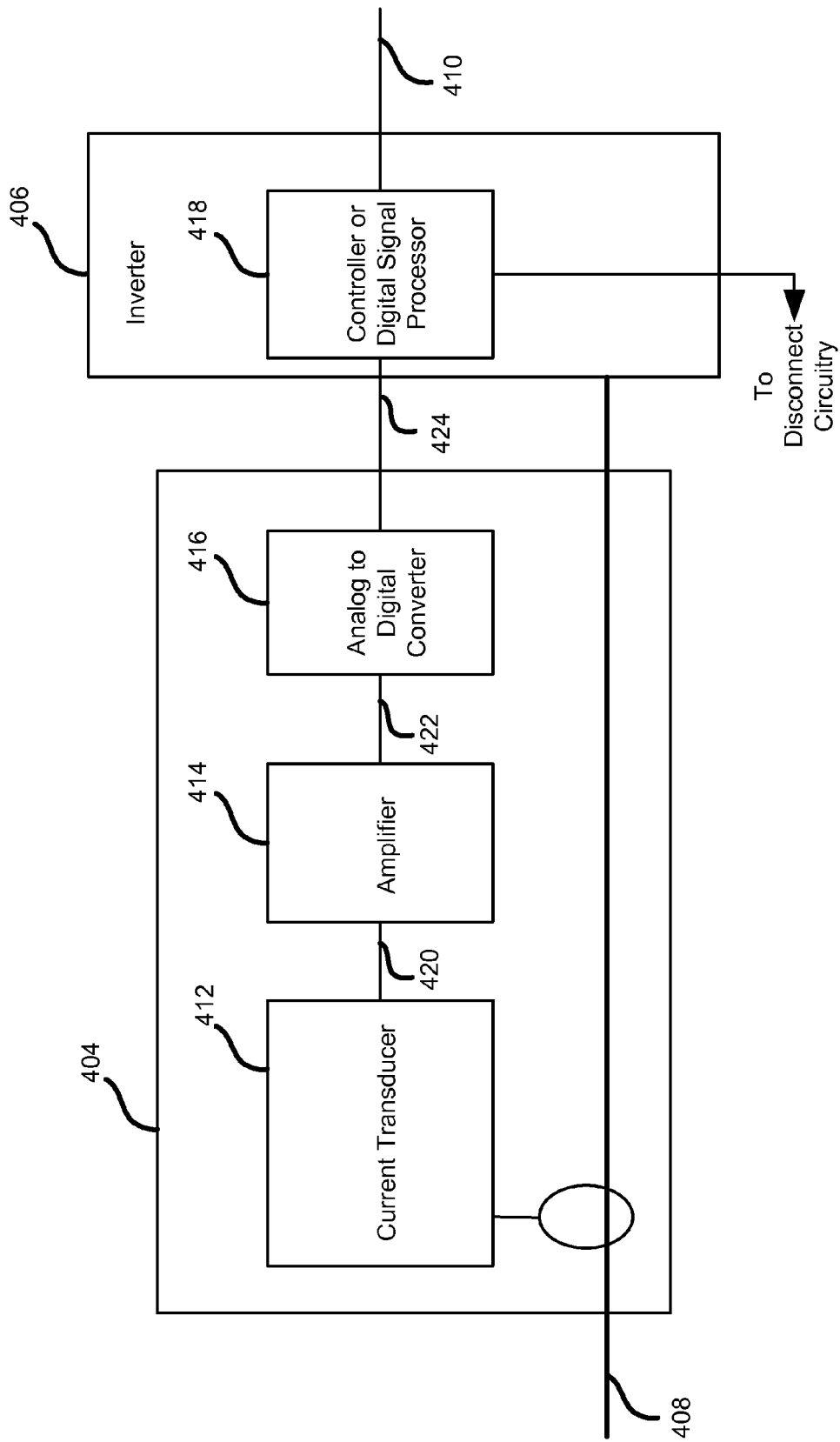
FIG. 4 is a block diagram depicting another exemplary embodiment of the ground fault detector and interrupter described with reference to FIG. 1.

Referring now to FIG. 4, another embodiment is depicted in which a controller or digital signal processor is physically located in the inverter 418 rather than in the ground fault detector and interrupter 404. Functionally, however, the controller or digital signal processor 418 can be shared by both the ground fault detector and interrupter 404 and the inverter 418. Simplicity of design and potential reduction of cost are advantages achieved by the embodiment depicted in FIG. 4 by sharing the functionality of the controller or digital signal processor 418 for applications carried out by both the ground fault detector and interrupter 404 and the inverter 406. In yet other embodiments, the A/D converter 416 and the controller or digital signal processor 418 may be both implemented within the inverter 406. For example, a multi-channel A/D converter 416 may be used in the inverter 406 to convert both current transducer signals and one or more other inputs (e.g., a temperature input) to digital signals.

Figure 5:
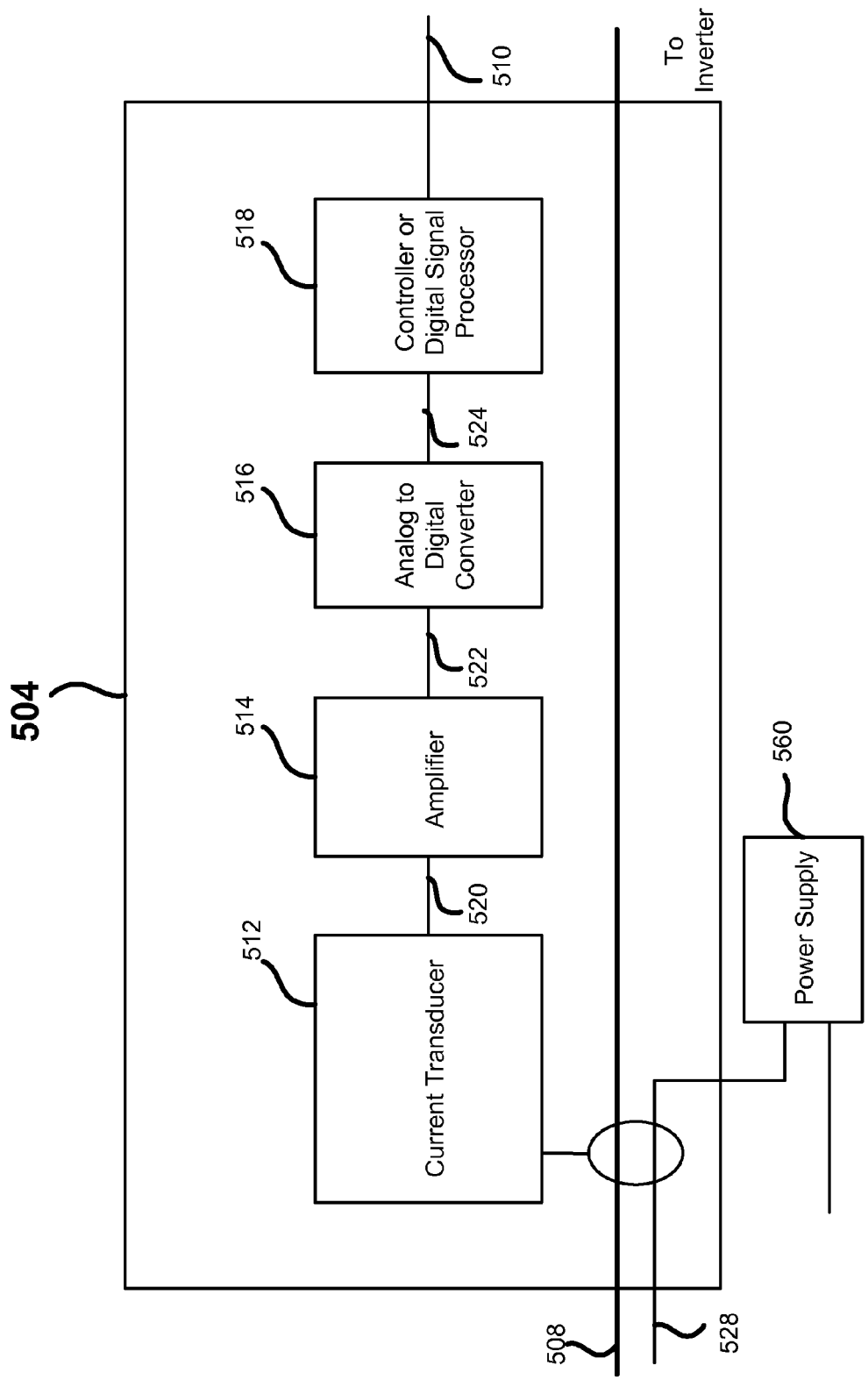
FIG. 5 is a block diagram depicting yet another exemplary embodiment of the ground fault detector and interrupter described with reference to FIG. 1.

Referring now to FIG. 5, shown is another embodiment of a ground fault detector and interrupter 504, which utilizes a reference signal provided by a neutral line 528 feeding a power supply 560, thereby obviating the need for a separate signal generator 226 as depicted in FIG. 2. In this embodiment, the power supply 560 provides power to one or more components of the ground fault detector and interrupter 504 and/or inverter (e.g., inverter 106) (for example, +5V, +12V, +15V and +24V, all relative to ground) for logic processing.

In operation, the frequency of the current in the neutral line 528 (e.g., 60 Hz) is detected by the controller or digital signal processor 518, so long as the chain of fault detection components 512, 514, 516, 518 are functioning properly. In particular, if the fault detection components 512, 514, 516, 518 are functioning properly, DC current transducer 512 produces a signal 520 indicative of both the 60 Hz current and any differential current between the supply lines 508. The signal 520 from the transducer 520 is then amplified by the amplifier 514 to generate an amplified signal 522, and the amplified signal 522 is converted to a digital signal 524 by the A/D converter 516. The digital signal 524 is then filtered by the controller or digital signal processor 518 to detect whether the 60 Hz signal is present. If the 60 Hz signal is present, then the processing chain 512, 514, 516, 518 is functioning properly, and the filtered signal is assessed by the controller or digital signal processor 518 to determine whether the differential current (if any) between lines 508 exceeds a threshold.

If the reference signal (e.g., 60 Hz signal) is not present, then the controller or digital signal processor 518 will initiate action to decouple the photovoltaic array 102 from the PV energy conversion system 100 and from ground by sending a signal 510 (e.g., to disconnect module 112).

Figure 6:
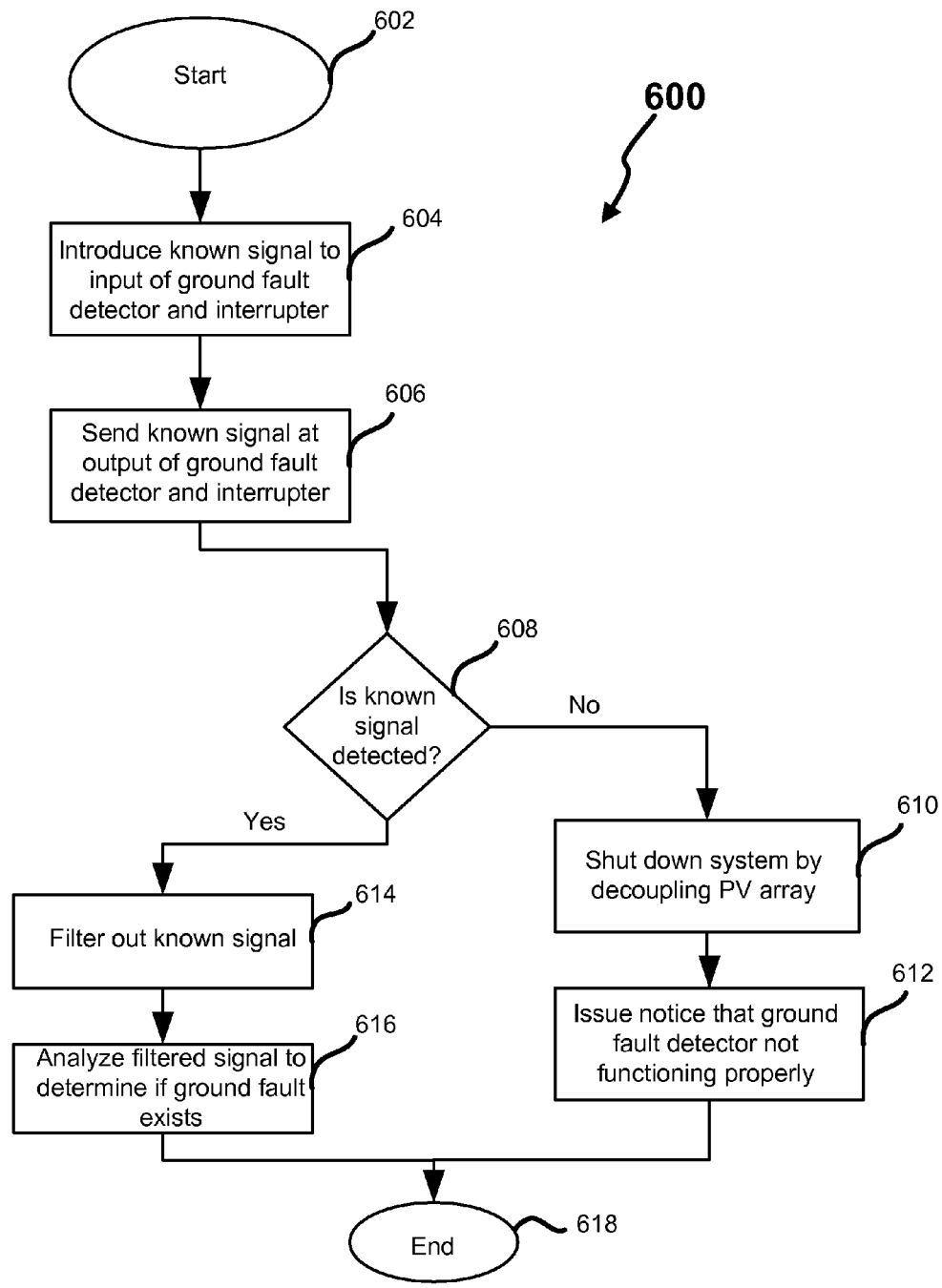
FIG. 6 is a flowchart depicting an exemplary method that may be carried out in connection with the embodiments discussed with reference to FIGS. 1-5.

Referring next to FIG. 6, shown is a flowchart 600 depicting an exemplary method that may be carried out in connection with the embodiments discussed with reference to FIGS. 1-5. As shown at block 604, a known signal (e.g., a signal provided from signal generator 226, a signal inherent to the system 100, a signal provided by power supply 528 or other identifiable signal) is introduced to the input of the ground fault detector and interrupter (e.g., to the current transducer 212, 312, 412, 512) along with a signal indicative of any ground fault within the PV array 102. Next, at block 606, the known signal is sensed (e.g., by the controller or digital signal processor 218) at an end of a processing chain of the ground fault detector and interrupter (e.g. processing chain 212, 214, 216, 218).

As shown, block 608 represents a conditional branch which impacts the flow of the method depending on whether the known signal is detected or not. If the known signal is not detected, then at block 610 the PV energy conversion system 100 is shut down (e.g., by decoupling the PV array 102 from the remaining portions of the system 100 responsive to a signal from controller or digital signal processor 218, 318, 418, 518), and at block 612, a notice is issued (e.g., by controller or digital signal processor 218, 318, 418, 518) indicating the ground fault detector and interrupter 104, 204, 304, 504 is not functioning properly. If the known signal is recognized at block 606, then at block 614 the known signal is filtered out (e.g., by the controller or digital signal processor 218, 318, 418, 518), and at block 616 the filtered signal carrying a signal indicative of any ground fault in the PV array is analyzed to determine whether a ground fault condition exists.

Figure 7:
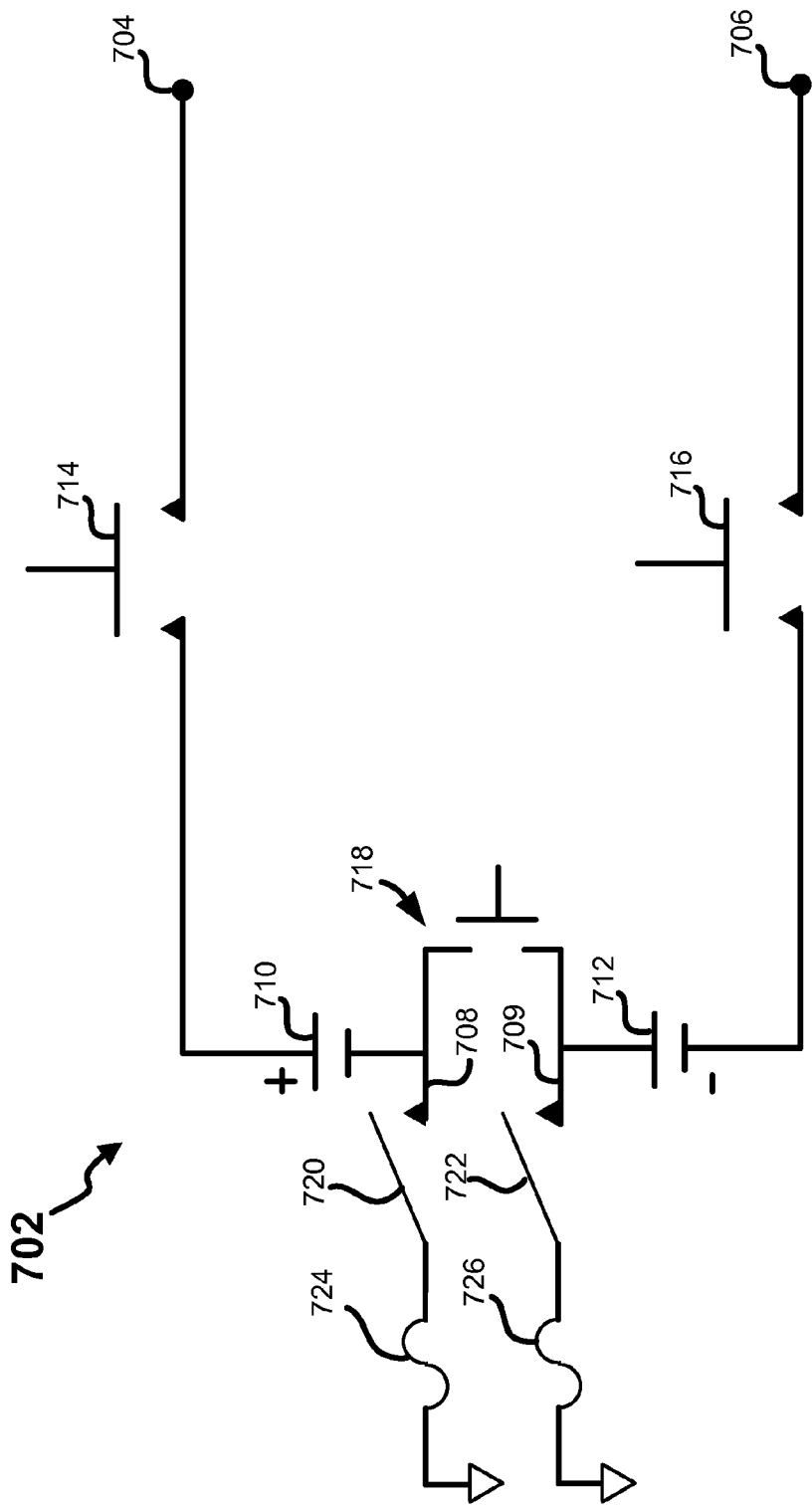
FIG. 7 is a schematic representation depicting an exemplary embodiment of a portion of the system described with reference to FIG. 1.

FIG. 7 is a schematic view of a portion of another embodiment of the photovoltaic energy conversion system 100 comprising a bipolar photovoltaic array 702, and a novel structure and method to decouple the bipolar photovoltaic array 702 once a ground fault condition requiring system interruption is detected. This type of photovoltaic array 702 is commonly referred to as a bipolar connected array: a photovoltaic array that has two rails, such as rails 704 and 706, each rail having opposite polarity relative to ground. This circuit configuration allows, using a first half of the photovoltaic array 710, the generation of a positive voltage relative to ground, and using a second half of the photovoltaic array 712 the generation of a negative voltage relative to ground.

As shown, main DC contactors 714 and 716 are coupled between the PV array 702 and outputs at rails 704 and 706, respectively. The main DC contactors 714, 716 are used to couple and decouple the PV array 702 from the remainder of the photovoltaic energy conversion system (e.g., system 100), and the outputs 704, 706 are typically coupled to an inverter (e.g. inverter 106). A PV tie 718, which may be a DC contactor similar in structure to the main DC contactors 714 and 716, is coupled to the PV array 702 at points surrounding the neutrals 708, 709 of the array, as illustrated in FIG. 7. Auxiliary switches 720 and 722 are also coupled to points surrounding the neutrals of the arrays 708, 709 and to ground. Coupled to each auxiliary switch 720 and 722 are fuses 724 and 726. In one embodiment, the fuses 724 and 726 are rated at 3 amperes; however one skilled in the art will readily appreciate that such fuses may be selected from a wide variety of values based on the particular implementation and codes or regulations that are applied to the system in its installation setting. In one embodiment, the controller or digital signal processor (e.g., 218, 318, 418, 518 not shown in FIG. 7) is coupled to the main DC contactors 714 and 716, the PV tie 718, and the auxiliary switches 720, 722, and is used to set the state (open or closed) of these components.

Electrical codes (such as the National Electrical Code—NEC) that may apply to photovoltaic energy conversion systems 100 in some cases may require that one side of a photovoltaic array be grounded (See, for example, NEC Article 690). This requirement may present a problem when interfacing, for example, with a 120/240 Volt AC utility grid that also requires its neutral point to be grounded. In order to ground both the array and the utility as required by code, photovoltaic systems have commonly employed an isolation transformer (not shown) in the inverter 106 to allow the grounding of both the array and the grid.

When a ground fault condition that requires interruption arises, care must be taken to ensure that the photovoltaic energy conversion system 100 is shut down safely. Such a ground fault condition arises when a fault within one of the halves 710 and 712 of the photovoltaic array 702 occurs, and a special procedure for decoupling the PV array 702 from the system may be followed.

For example, the DC contactors 714 and 716 may be opened first to remove the virtual ground imposed on the arrays 710 and 712 by the action of the inverter. This configuration is called a "virtual ground." The inventors have demonstrated to various testing agencies that this virtual ground configuration stays at or near ground at the conditions and configurations described herein. Once the contactors 714, 716 are opened, the PV tie contactor 718 may be opened so as to isolate the positive and negative arrays 710 and 712. Finally, the neutrals 708, 709 of the arrays 710, 712 are connected to ground with switches 720 and 722. If the ground current is still present, the appropriate fuse 724 or 726 will open; thus interrupting the ground current and preventing hazardous currents from flowing.

Figure 8:
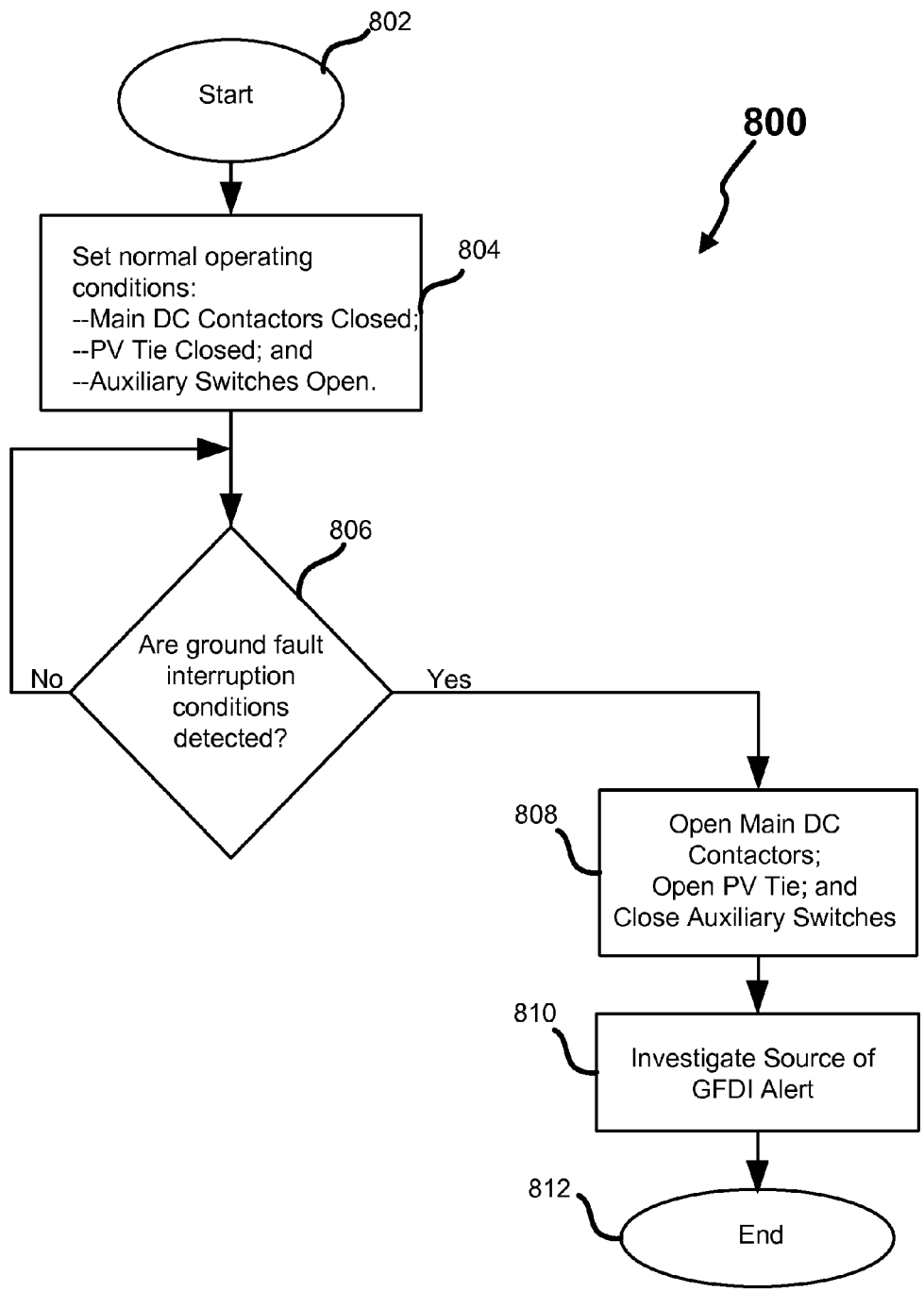
FIG. 8 is a flowchart depicting an exemplary method that may be carried out in connection with the embodiments discussed with reference to FIGS. 1-7.

Referring next to FIG. 8, shown is a flowchart 800 depicting an exemplary method that may be carried out in connection with the embodiment discussed with reference to FIG. 7. In block 804, normal operating conditions are set. Under normal operating conditions (e.g., after the PV energy conversion system 100 has been safely started up), the main DC contactors 714 and 716 are closed to allow current generated from the PV array 702 to flow to the inverter (e.g., 106), the PV tie 718 is closed, and the auxiliary switches 720 and 722 are open. As reflected at block 806, the ground fault detector and interrupter (e.g., 104) continuously operates, as illustrated by the "NO" branch in block 806, to detect ground fault conditions that require system interruption. If a ground fault condition that requires interruption is detected, then the method moves to block 808, where the main DC contactors 714 and 716 are opened, the PV tie contactor 718 is opened, and the auxiliary switches 720 and 722 are closed.

When a ground fault is detected, a ground fault light on the front panel of the inverter may illuminate. As depicted, the method branches to block 810, where actions are taken to investigate the source of the ground fault detection and interruption alert.

One advantage of the structure and method disclosed in FIGS. 7 and 8, respectively, is that they reduce the cost of implementation. By using the PV tie 718 and auxiliary switches 720 and 722 to keep the neutrals 708 and 709 at virtual ground, the need to install expensive, heavy gauge neutral wires from the PV array (typically located on a roof or another remote location) to an electrical service panel is avoided. In one embodiment, the controls for the interruption portion and the fuse portion of the ground fault detector and interrupter (e.g., 104) is enclosed in a small block that it is mounted on a sub-chassis. That sub-chassis can be easily installed up on the roof or where ever the PV array 702 is physically located. Although heavy duty wires must be connected to the sub-chassis, but only light duty wires need to run down to the inverter.

In conclusion, the present invention provides, among other things, a system and method for detecting ground fault conditions that require system interruption of a photovoltaic energy conversion system. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claim is:

1. An apparatus for interrupting a photovoltaic energy conversion system that employs a bipolar photovoltaic array, the apparatus comprising:
    a fault detector and interrupter configured to be coupled to the first and the second rails of the photovoltaic array, the fault detector and interrupter configured to detect a condition that requires interruption of the photovoltaic energy conversion system and open a PV tie to uncouple two PV arrays of the bipolar photovoltaic array, thereby decoupling the two PV arrays; and
    a controller configured to, after the PV tie is opened, open a plurality of main DC contactors thereby decoupling the bipolar photovoltaic array from a remainder portion of the energy conversion system.

2. A method for interrupting a photovoltaic energy conversion system that employs a bipolar photovoltaic array, the method comprising:
    detecting a condition that requires interruption of the photovoltaic energy conversion system;
    opening a PV tie to uncouple two PV arrays of the bipolar photovoltaic array, thereby decoupling the two PV arrays;
    after the PV tie is opened, opening a plurality of main DC contactors thereby decoupling the bipolar photovoltaic array from the energy conversion system.

3. A photovoltaic energy conversion system comprising:
    a bipolar photovoltaic array including a first PV array and a second PV array, the first PV array configured to apply, relative to a potential of ground, a positive potential at a first rail and the second PV array configured to apply, relative to the potential of ground, a negative potential at a second rail;
    an inverter configured to convert the voltage between the positive and negative potentials that are applied to the first and second rails to an alternating current;
    a first DC contactor coupled to the first rail so as to enable the first PV array to be decoupled from the inverter, and a second DC contactor coupled to the second rail so as to enable the second PV array to be decoupled from the inverter;

a PV tie coupled between the first and second PV arrays, the PV tie configured to couple and decouple the first and second PV arrays; and a fault detector coupled to the first and second DC contactors and the PV tie, the fault detector and interrupter configured to detect a condition that requires interruption of the photovoltaic energy conversion system and open the PV tie and the first and second DC contactors to uncouple two PV arrays of the bipolar photovoltaic array and decouple the bipolar photovoltaic array from the inverter.

* * * * *